United States Patent
Lysinger et al.

(10) Patent No.: US 6,678,184 B2
(45) Date of Patent: Jan. 13, 2004

(54) CAM CELL HAVING COMPARE CIRCUIT FORMED OVER TWO ACTIVE REGIONS

(75) Inventors: Mark A. Lysinger, Lewisville, TX (US); Christophe Frey, Meylan (FR); Frederic LaLanne, Bernin (FR)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/163,848

(22) Filed: Jun. 5, 2002

(65) Prior Publication Data

US 2003/0227787 A1 Dec. 11, 2003

(51) Int. Cl.$^7$ .......................... G11C 15/00; G11C 11/40
(52) U.S. Cl. ...................... 365/49; 365/156; 365/189.07
(58) Field of Search ........................... 365/49, 51, 52, 365/189.07, 54, 156

(56) References Cited

U.S. PATENT DOCUMENTS 6,044,005 A * 3/2000 Gibson et al. ................. 365/49
6,108,227 A * 8/2000 Voelkel ......................... 365/49
6,373,739 B1 * 4/2002 Lien et al. ..................... 365/49
6,421,265 B1 * 7/2002 Lien et al. ..................... 365/49

* cited by examiner

Primary Examiner—Son Mai
(74) Attorney, Agent, or Firm—David V. Carlson; Lisa K. Jorgenson

(57) ABSTRACT

A Content Addressable Memory (CAM) cell is disclosed having an physical implementation of transistors for improving the semiconductor substrate area utilization of the CAM cell and the CAM array. The CAM cell comprises a first and second memory circuit and a compare circuit. The compare circuit of six transistors formed over two active regions. The local interconnect between the compare circuit and the first memory circuit formed of a polysilicon region. The local interconnect between the compare circuit and the second memory circuit formed of polysilicon and conductive regions.

28 Claims, 5 Drawing Sheets

CAM CELL HAVING COMPARE CIRCUIT FORMED OVER TWO ACTIVE REGIONS

FIELD OF THE INVENTION

The present invention relates to content addressable memory (CAM) cell. More specifically, this invention relates to the structures and methods for improving area utilization of semiconductor substrate in a CAM cell.

BACKGROUND OF THE INVENTION

In the communication industry, there is often a need for determining associative relationships between a first data element and a second data element. To meet this need, a Content Addressable Memory (CAM) is used to make a comparison of an input data value and a stored data value in the CAM cell. For example, the input data value could be a packet header containing the address of a computer in a network of computers. The stored data values could be all the addresses of the computers within the network. A CAM cell array contained within a network router would determine whether there is an association between the address in the packet header and the addresses of the computers in the network. In determining the association, a search and comparison method must be performed between the address in the packet header and all the addresses in the network. This search and comparison method is both time and resource intensive using a traditional solutions consisting of RAM, CPU and software algorithm. Further, with large input data words such as 32 and 64 bits, the search and comparison method using traditional solutions is less efficient than a CAM cell array. Content Addressable Memories provide a solution for fast search and compare operations.

Generally a CAM cell is composed of a first memory circuit, a second memory circuit and a compare circuit. A CAM array is composed of individual CAM cells. Each CAM cell receives one bit of the input data word. The bit is compared to the data stored in the first memory circuit of the CAM cell. The second memory circuit of the CAM cell stores an enable value. The enable value is used to enable or disable a CAM cell in the CAM array during data comparison which allows a portion of the input data word to be enabled for comparison and another portion to be disabled for comparison during the match phase of the sequence.

There is a desire to reduce the semiconductor substrate area used by the CAM cell in order to provide an increase in performance and achieve improved packing density. The reduction in substrate area is determined by the placement, organization, and interconnections of the transistors of the CAM cell.

BRIEF SUMMARY OF THE INVENTION

Accordingly, an embodiment of the present invention provides a CAM cell comprising a first memory circuit, second memory circuit and a compare circuit. The first memory circuit comprises a six-transistor SRAM cell. The second memory circuit comprises a six-transistor SRAM cell. Of course, the memory circuits can be any acceptable memory circuits including flip-flops, EEPROM memory cells, cross-coupled invertors, NOR gates, or any other acceptable memory circuit. The compare circuit is a six-transistor structure organized in two parallel stacks of three transistors in one embodiment. Alternatively, a compare circuit having a five-transistor structure may be utilized having two parallel stacks each containing two transistors and a common fifth transistor.

The first memory circuit is coupled to a first word line, to a first bit line and to a second bit line. The first memory circuit stores a data value for comparing to an input data bit. The first memory circuit provides signals data-true and data-false to the compare circuit where the data signals are compared to first and second input data signals cf and ct. The second memory circuit is connected to a second word line, to the first bit line and to the second bit line. The second memory circuit stores a mask data value. The second memory circuit provides signal mask-true to the compare circuit to enable or disable the compare circuit.

According to an embodiment of the present invention, the interconnections of the transistors of the first and second memory circuits to the transistors of the compare circuit are comprised of regions of conductive material.

According to a first embodiment, the conductive material is polysilicon. In alternative embodiments, the conductive material is a metal layer, and can be any acceptable metal including aluminum, copper, tungsten, titanium polysilicides, or various combinations or alloys thereof. Of course, the type of conductive used can be changed within a cell from poly to a metal by the appropriate contacts, vias, and interconnections to provide a conductive path from the memory circuits to the appropriate nodes in the compare circuit.

An embodiment of the present invention provides a method of operating a CAM cell comprising the steps of storing data in the CAM cell; applying a signal to an enable line of the device wherein the enable line is a shared-gate structure, and thereby enabling the device; applying an input data; comparing the input data to the first data; and outputting a status change on a match signal line.

An embodiment of the present invention provides a method of operating a CAM cell wherein the step of storing further comprises the step of storing data in a first memory circuit and an enable value in a second memory circuit. To store data in the first memory circuit, a value is applied to a first word line; the data to a first bit line; the data complement to a second bit line; then storing a data value in a first memory circuit. An enable value is stored in a second memory circuit in a similar manner and is used to set an enable or disable terminal in the compare circuit.

In an embodiment of the present invention, a content addressable memory is formed in an integrated circuit having improved semiconductor substrate area utilization.

An embodiment of the present invention provides an improvement to the area utilization of the integrated circuit by reducing the layout area of the CAM cell, thus reducing the cost of manufacture. The embodiments of the present invention are applicable to binary and ternary CAM cells as well as four state CAM cells.

An advantage of the invention is that the CAM cell is fast in determining a match or no match decision when given a large data input word.

An advantage of the invention is a CAM cell with an improved organization of transistors that reduces the substrate area of the CAM cell and array.

An advantage of the invention is a CAM cell with an improved interconnection of transistors that is a small size for the CAM cell and array.

DETAILED DESCRIPTION OF THE INVENTION

Figure 1:
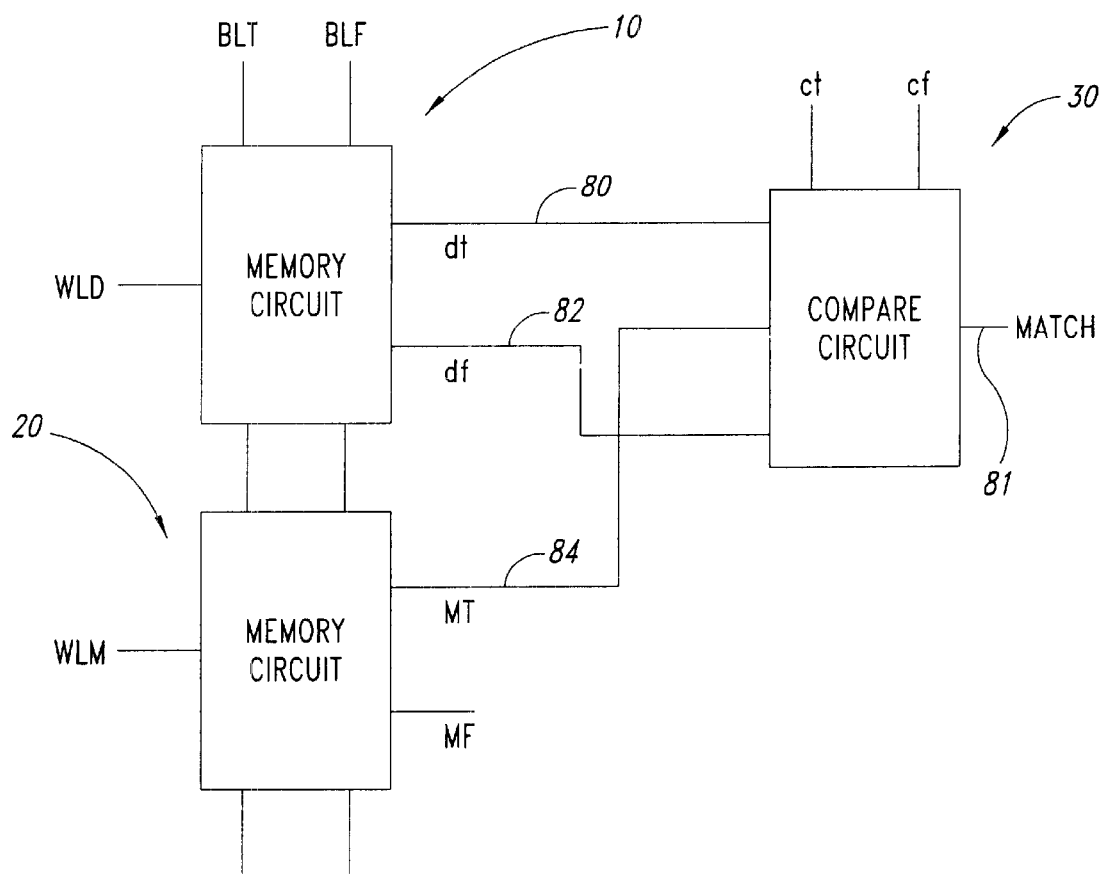
FIG. 1 is a schematic diagram of first and second memory circuits and a compare circuit of a CAM cell according to one embodiment of the present invention.

FIG. 1 shows a first memory circuit 10, a second memory circuit 20, and a compare circuit 30 forming a CAM cell according to the present invention. The first and second memory circuits 10, 20 are used to store a data value and a mask value, respectively. The mask value is the enable or disable signal provided to the compare circuit 30. The compare circuit 30 as shown in FIG. 1 is used to compare the stored data value in the first memory circuit 10 to input data signals cf and ct. When the second memory circuit 20 has stored an enable value, the true mask signal enables the compare circuit 30 to permit a comparison to occur and when a disable value has been stored, the true mask signal disables the compare circuit 30 so a comparison does not occur. The match line provides an output of the results of the comparison. When the compare circuit is enabled and there is a match between the stored data and the compare data, the match line state remains in the same state, staying high or staying low. When the compare circuit is enabled and there is not a match, the state of the match line is changed, going from high to low. If any one CAM cell of the many connected to Match line is not a match, the line will be pulled low. If p-channel transistors are used for the compare cell, the line will transition from high to low. The signal line 80 provides the interconnection from the first memory circuit 10 to the compare circuit 30 for the data-true signal. The signal line 82 provides the interconnection from the memory circuit 10 to the compare circuit 30 for data-false signal. The match-true data is provided on signal line 84 from the second memory circuit 20 to the compare circuit 30 and the match-false data is not output from the second memory circuit 20 because in this particular embodiment there is no use of the match-false signal in the compare circuit 30. In an alternative design, the match-false signal may be used, however, in the particular design selected the compare circuit 30 is constructed to permit enabling or disabling of the cell based solely on the signal value of the match-true output from the second memory circuit 20 so that the match-false output is not needed.

Figure 2:
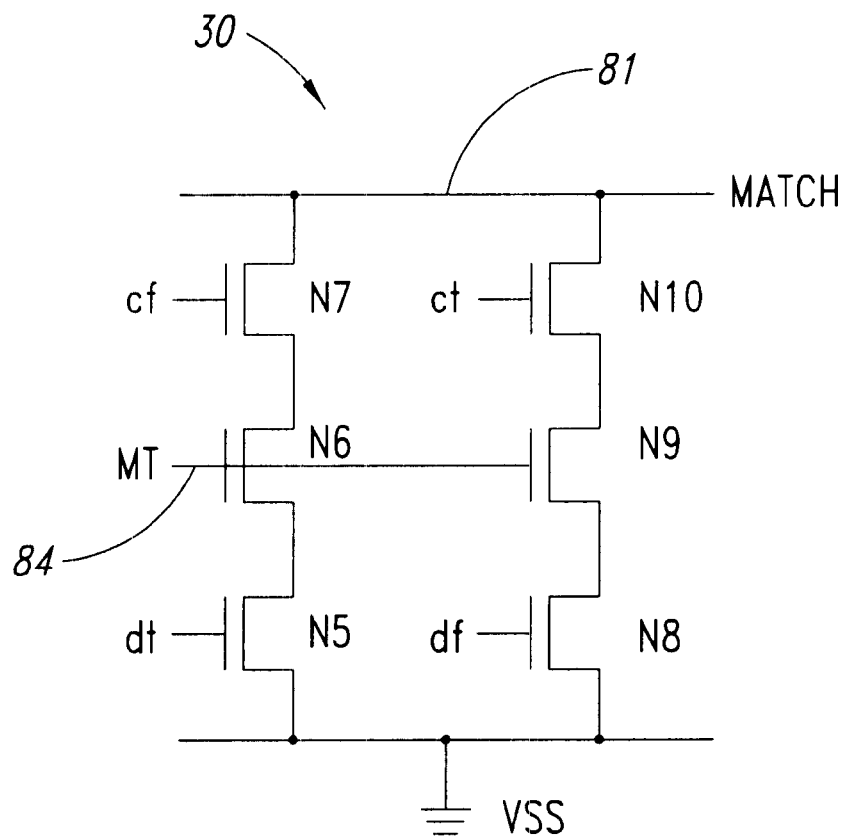
FIG. 2 is an embodiment of a compare circuit of a CAM cell of FIG. 1.

FIG. 2 is an embodiment of the compare circuit 30 of FIG. 1. In the embodiment of FIG. 2, six transistors are used, N5–N10, in order to provide the compare function of the compare circuit 30 of FIG. 1. In this embodiment, as shown, all of the transistors are n-channel transistors and the description to follow with assume that n-channel transistors are used in the compare circuit. Alternative embodiments may use other transistor types. For example, p-channel transistors could be used for some, or all, of the transistors and the appropriate signal levels would be reversed for those p-channel transistors as well as the respective connections to ground and power as such is considered equivalent and easily accomplished by those of skill in the art.

Figure 3:
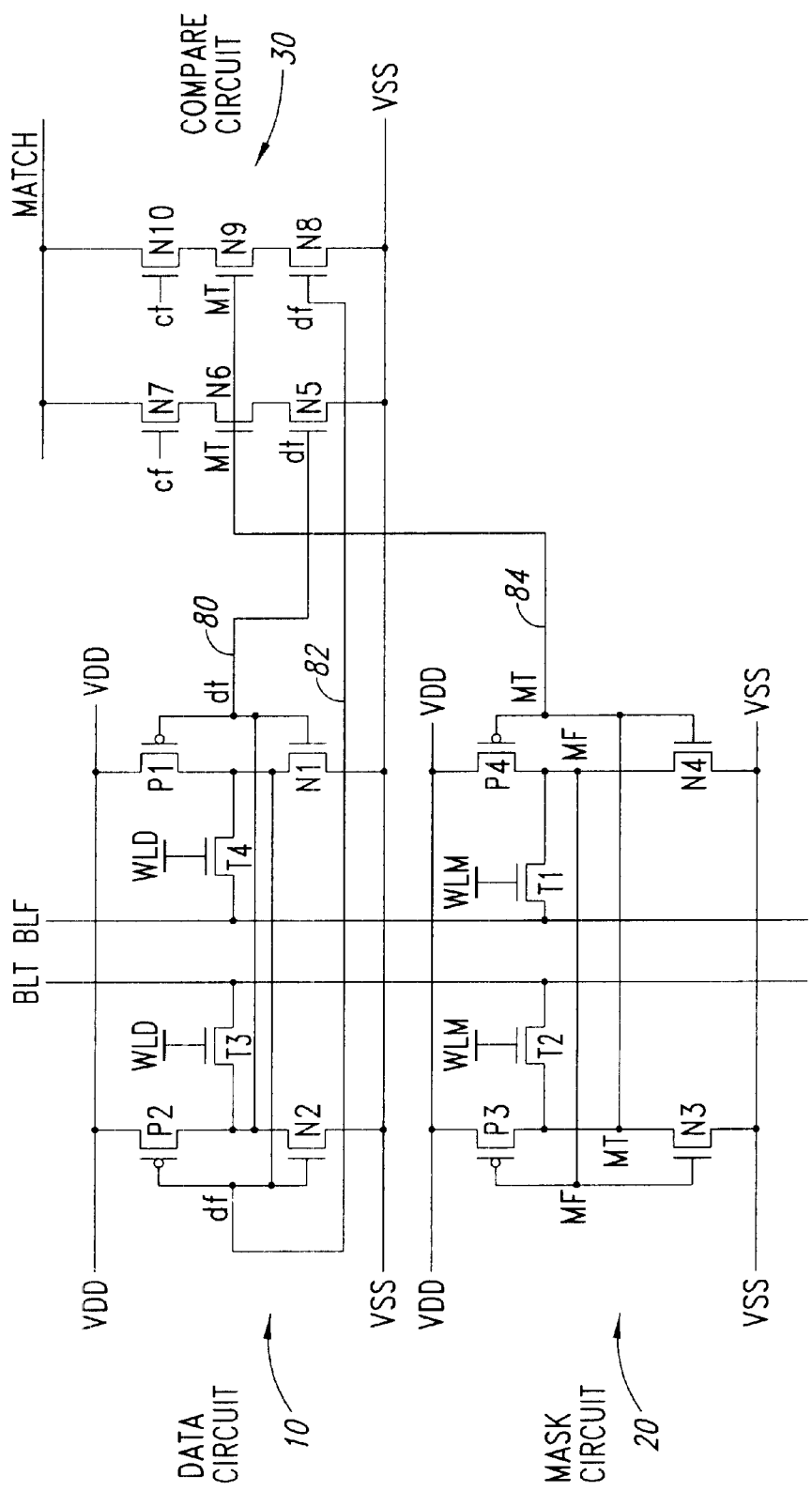
FIG. 3 is an embodiment of the transistor schematic connection of a CAM cell according to the present invention.

In the embodiment of FIG. 3, the match-true signal line 84 is provided to two transistors, N6 and N9, to provide the disable and enable function. When the match-true signal on line 84 is high, the compare circuit 30 is enabled with both transistors N6 and N9 turned on to permit the comparison to occur. On the other hand, when the signal on line 84 is low, the transistors N6 and N9 are disabled so that a comparison between the stored data and the compare data cannot occur. In this particular embodiment, the match disable transistors are positioned between the respective compare transistors and the data transistors so as to provide two separate series chains between the match line and ground line, both of which include a respective match disable transistor. This particular transistor structure thus provides completely independent and individualized path from the match data signal line to ground According to a preferred embodiment, the schematic of FIG. 3 is laid out in silicon as will now be illustrated with respect to FIGS. 3–5

Figure 4:
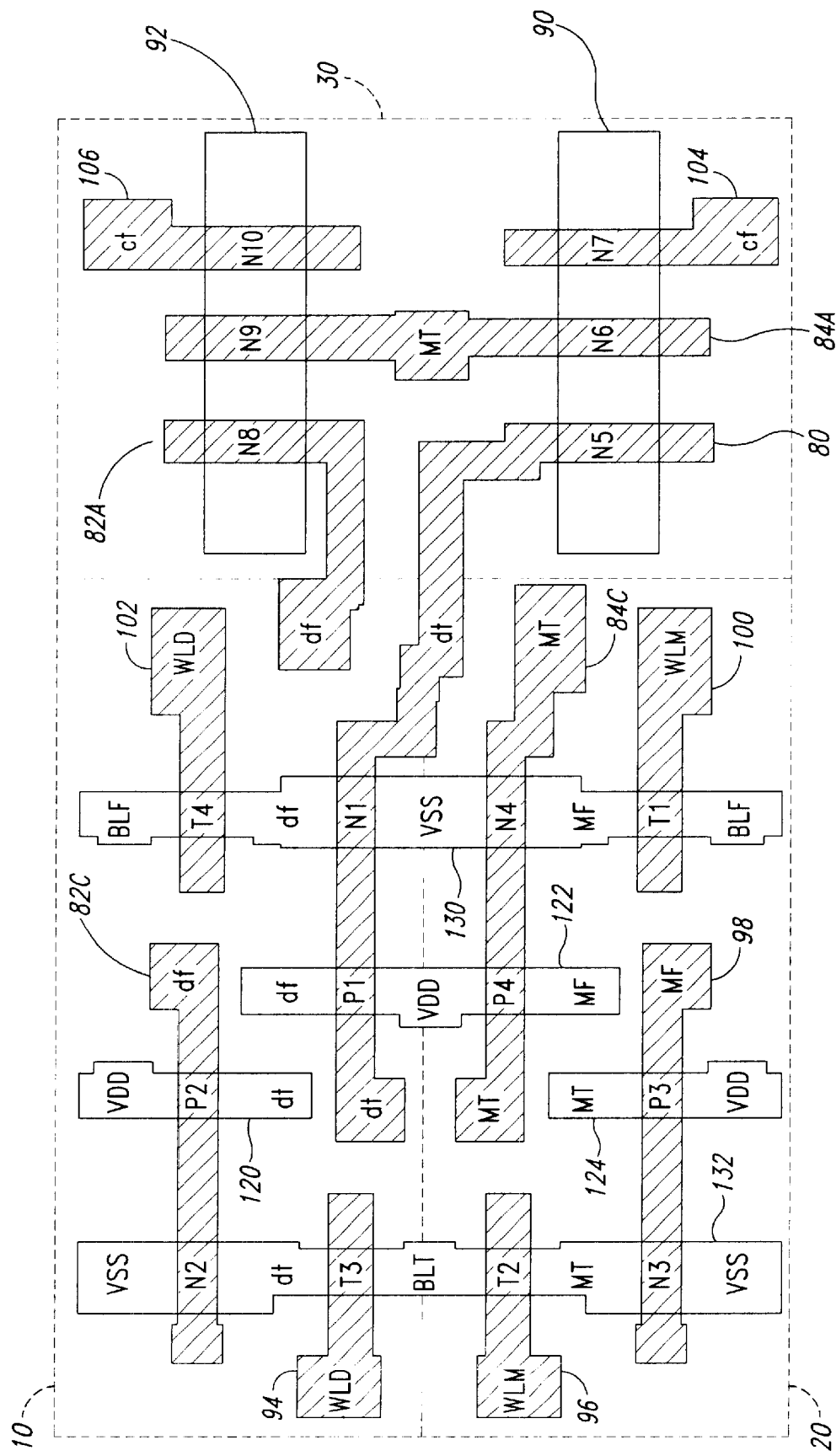
FIG. 4 is a top side plan view of the layout in silicon of a CAM cell illustrating active regions and polysilicon according to one embodiment.

FIG. 4 shows the detail electrical schematic of the CAM cell of FIG. 1 with the embodiment of the compare circuit of FIG. 3 being used.

Figure 5:
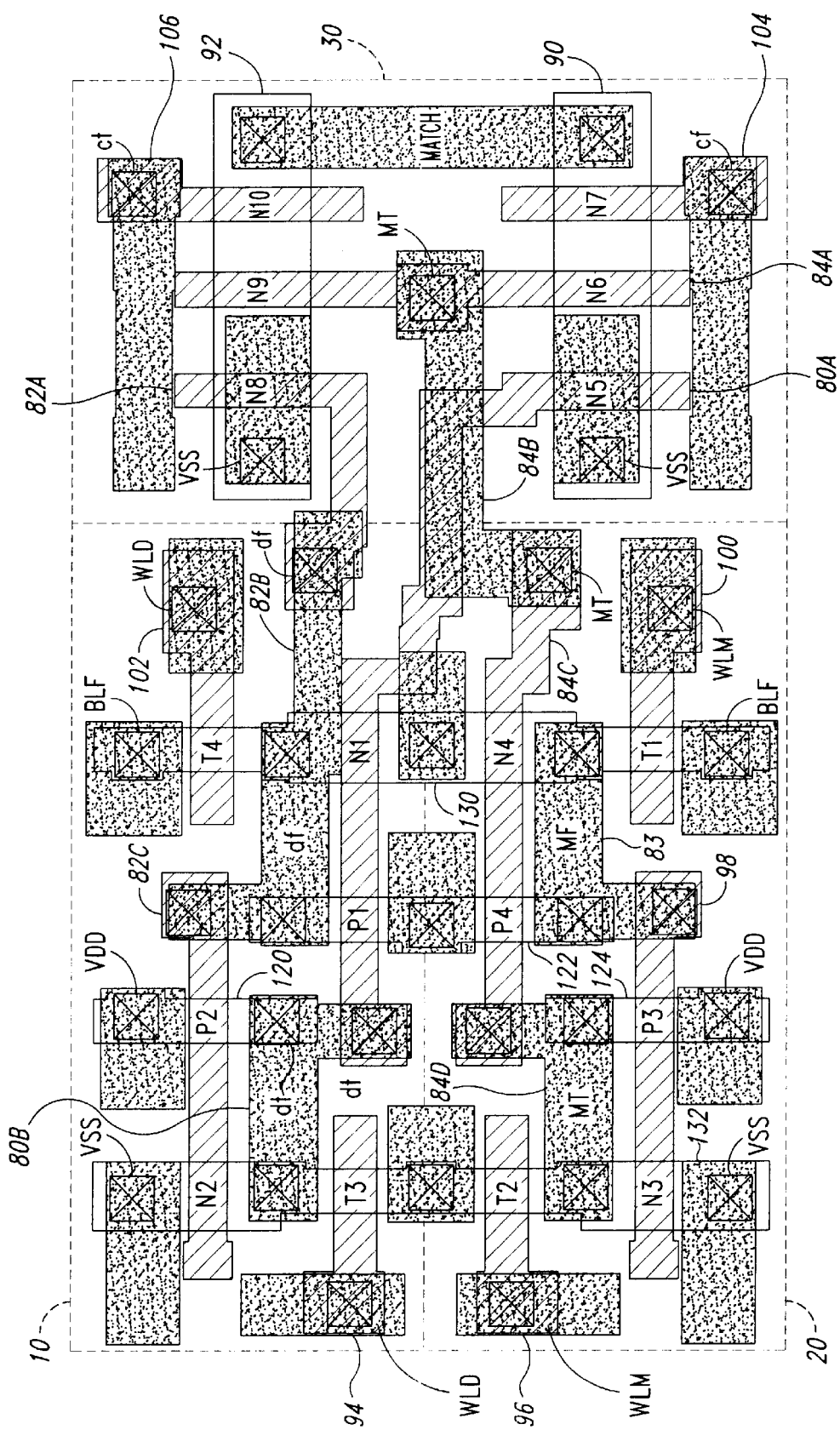
FIG. 5 is a top side plan view of the layout in silicon of FIG. 5 also showing the additional layers of a CAM cell illustrating active metal and contacts.

The labels of the transistors N5 through N10 as shown in FIG. 3 are also shown in FIGS. 4 and 5, and are placed over the gate region of the respective transistor for convenience in reference, of course, the transistors also include the source and drains regions as well. The labels for the transistors N1–N4, P1–P4, and T1–T4 of the first and second memory circuits 10 and 20 as shown in FIG. 3 are shown in FIGS. 4 and 5 also, and are placed over the gate region of the respective transistor for convenience, but also include the source and drain regions as well.

An embodiment of the schematic of the entire CAM cell is shown in FIG. 3. The first memory circuit 10 is a data cell that stores the data value. The second memory circuit 20 is a mask cell that stores the mask value. The first memory circuit 10 comprises transistors P1, N1, T4, T3, N2, and P2. The second memory 20 cell comprises transistors N4, P4, T1, T2, N3, and P3. The compare circuit 30 comprises transistors N5–N10.

As shown in FIG. 3, the first memory circuit 10 is used to store a data value, and is thus labeled as a data circuit. The stored data value is then compared to an input data value by the compare circuit 30. The first memory circuit 10 is electrically connected as a standard six-transistor, full CMOS SRAM cell. It has the following organization. The gate of the second pull-down transistor N2 of the first memory circuit 10 is electrically coupled to the gate of the second pull-up transistor P2, to the drain region of the first pull-down transistor N1, to the drain region of the first pull-up transistor P1, to the drain region of the first pass transistor T4 and to the gate of the data-false transistor N8 of the compare circuit 30, thereby defining the data-false df node 82. The gate of the first pull-down transistor N1 of the first memory circuit 10 is electrically coupled to the gate of the first pull-up transistor P1, to the drain region of the second pull-down transistor N2, to the drain region of the second pull-up transistor P2, to the drain region of the second pass transistor T3 and to the gate of the data-true transistor N5 of the compare circuit 30, thereby defining the data-true dt node 80. The first pass transistor T4 of the first memory circuit 10 has a gate electrically coupled to a first word line signal WLD and has a source region electrically coupled to a false bit line signal BLF. The second pass transistor T3 of the first memory circuit 10 has a gate electrically coupled to the first word line signal WLD and has a source region electrically coupled to a true bit line signal BLT.

As shown in FIG. 3, the second memory circuit 20 is used to store a mask value MT and is thus labeled as a mask circuit. The mask value MT of node 84 enables or disables the compare circuit 30. The second memory circuit 20 is also a standard 6-transistor full CMOS SRAM cell. It has the following organization. The gate of the second pull-down transistor N3 of the second memory circuit 20 is electrically coupled to the gate of the second pull-up transistor P3, to the drain region of the first pull-down transistor N4, to the drain region of the first pull-up transistor P4, and to the drain region of the first pass transistor T1, thereby defining the mask-false MF node. The gate of the first pull-down transistor N4 of the second memory circuit 20 is electrically coupled to the gate of the first pull-up transistor P4, to the drain region of the second pull-down transistor N3, to the drain region of the second pull-up transistor P3, to the drain region of the second pass transistor T2, and to the gates of the first and second enable transistors N6 and N9 of the compare circuit 30, thereby defining the mask-true MT node 84. The first pass transistor T1 of the second memory circuit 20 has a gate electrically coupled to the second word line signal WLM, and a source region electrically coupled to the false bit line signal BLF. The second pass transistor T2 of the second memory circuit 20 has a gate electrically coupled to the second word line signal WLM, and a source region electrically coupled to the true bit line signal BLT.

In the embodiment just described, the memory circuits 10 and 20 are both SRAM memory circuits of the six-transistor type. In an alternative embodiment, they are SRAM memory circuits of the four-transistor type. Thus, a four-transistor memory circuit using two polysilicon load resistors as the load devices may be used in place of each of the respective six-transistor cells as described in FIG. 3. In a further alternative embodiment, each of the memory circuits 10 and 20 is composed of another acceptable memory circuit. For example, they may be composed of an EEPROM, EPROM, ROM, flash memory circuit, or other acceptable volatile or nonvolatile memory circuit. Other types of data storage or organization may also be used including DRAMS, blown fuses, programmed ROMS, or other acceptable storage devices for the memory circuits 10 and 20. The outputs of the respective memory circuits 10 and 20 shown in FIG. 1 are therefore provided to the compare circuit 30 as shown in FIG. 1 and regardless of the particular type, arrangement, or structure of the particular memory inside each of the respective cells.

As shown in FIG. 3, the compare circuit 30 is used to compare a stored data value provided by signals dt of interconnect 80 and df of interconnect 82 in the first memory circuit 10 to an input data value of signals cf and ct. In a preferred embodiment, the compare circuit 30 is organized as two parallel stacks of N-type transistors, N5–N10. The compare-false transistor N7 has a gate electrically coupled to an input signal cf, a source region electrically coupled to the drain region of the first enable transistor N6, and a drain region electrically coupled to the MATCH signal. The compare-true transistor N10, has a gate electrically coupled to an input signal ct; a source region electrically coupled to the drain region of the second enable transistor N9, and a drain region electrically coupled to the MATCH signal. The first enable transistor N6 has a source region electrically coupled to the drain region of the data-true transistor N5. The second enable transistor N9 has a source region electrically coupled to the drain region of the data-false transistor N8. The organization of the transistors of the compare circuit has the advantage of reducing the substrate area utilization of the CAM cell.

As shown in FIGS. 4 and 5, the CAM cell can be laid out in silicon in a compact arrangement. The first memory circuit 10, second memory circuit 20 and compare circuit 30 are shown as they would be laid out in silicon. Within these figures, the active area is shown in dark outline, the polysilicon is in crosshatch, metal 1 is in stipple, and contacts are shown with an X in a box. The compare circuit 30 includes a first active region 92 and a second active region 90. In a preferred embodiment, both active regions 90 and 92 are N-type conductivity. The first active region 92 is formed below the gates of the compare-true transistor N11, the first enable transistor N9, and the data-false transistor N8. The first active region 92 is electrically connected to the MATCH signal at the drain region of transistor N10. The first active region is electrically connected to a first supply VSS at the source region of data-false transistor N8 as shown in FIG. 6. The second active region 90 is formed below the gates of compare-false transistor N7, the second enable transistor N6, and the data-true transistor N5. The second active region 90 is electrically connected to the MATCH signal at the drain region of transistor N7. The second active region 90 is electrically connected to the first supply VSS at the source region of data-true transistor N5 as shown in FIG. 5. The organization of the first and second active regions 92 and 90 has the advantage of reducing the substrate area utilization of the CAM cell. In an alternative embodiment the first and second active regions 92 and 90 are p-type conductivity. In an embodiment of the present invention as shown in FIGS. 4 and 5, the active regions of the first memory circuit are p-type conductivity regions 120, 122 and n-type conductivity regions 132, 130. In addition, the active regions of the second memory circuit are p-type conductivity regions 124, 122 and n-type conductivity regions 132, 130.

As shown in FIG. 4, the first supply VSS is electrically connected to the source region of first and second pull-down transistors N1 and N2 of the first memory circuit 10, to the source region of the first and second pull-down transistors N4 and N3 of the second memory circuit 20, to the source region of the data-true transistor N5 and to the source region of the data-false transistor N8. A second supply VDD is electrically connected to the source region of the first and second pull-up transistors P1 and P2 of the first memory circuit 10 and to the source region of the first and second pull-up transistors P4 and P3 of the second memory circuit 20. The interconnects 80, 82, 84 from the first and second memory circuits 10 and 20 to the compare circuit 30 are accomplished by regions formed of the polysilicon gate material, a conductive material or a combination of both materials. For example, the conductive material could be a metal such as aluminum, copper, or a second layer polysilicon region. The advantage of the interconnections is to reduce the area utilization of the CAM cell.

As shown in FIG. 4, the local interconnect 80 between the first memory circuit 10 and the compare circuit 30 is composed of a single strip of polysilicon that forms the gate of the first pull-down transistor N1 of the first memory circuit 10, the gate of the first pull-up transistor P1 of the first memory circuit 10 and the gate of the data-true transistor N5 of the compare circuit 30. In an embodiment, this local interconnect is a region of polysilicon 80 as shown in FIG. 4 and 5. The polysilicon region 80 is a portion of the data-true node dt. The same conductive strip that forms the gate is also the interconnection strip, so that the entire strip is a single, common contiguous layer of material.

As shown in FIG. 4, the local interconnect 84A is formed between gates of the first and second enable transistors N6 and N9 of the compare circuit 30, this is also a single contiguous layer of material, thus providing considerable savings. The local interconnect 84C is formed between the gates of the first pull-up and the first pull-down transistors P4 and N4 of the second memory circuit 20, this is also a single contiguous layer of material, thus providing considerable savings. The local interconnect 84B electrically couples interconnects 84A to 84C as shown in FIG. 5. In one embodiment, the node MT is formed of a multi-layer interconnect comprising the local interconnects 84A, 84B and 84C as shown in FIGS. 4 and 5. In a preferred embodiment, local interconnect 84A comprises a polysilicon region; local interconnect 84B comprises a conductive material such as aluminum or a second-layer polysilicon region; and local interconnect 84C comprises a polysilicon region.

As shown in FIG. 4, the local interconnect 82C forms the gate of the second pull-down transistor N2 and the gate of the second pull-up transistor P2. The local interconnect 82A forms the gate of the data-false transistor N8 of the compare circuit 30. As shown in FIG. 5, the local interconnect 82B electrically couples the local interconnect 82C to the interconnect 82A. In a preferred embodiment, local interconnects 82A, 82B, and 82C form the data-false node df as a multi-layer interconnect. The multi-layer interconnect comprises a region of metal 82B, a region of polysilicon 82A and a region of polysilicon 82C as shown in FIG. 5.

According to one embodiment of the present invention, the word line of the first memory circuit 10 is segmented within the memory circuit, as can be seen by viewing FIG. 4. The word line has two portions, a first portion 94 and a second portion 102. These word line portions are composed of the polysilicon gate material and are physically distinct and separate from each other. They are, of course, formed in the same layer by the deposition of a blank layer of polysilicon which is then patterned and etched to form all the polysilicon gates simultaneously using process techniques well known in the art. Generally, prior art SRAM memory circuits make use of a single contiguous unbroken strip of polysilicon to form the gate electrode for the two enable transistors T3 and T4 within the memory circuit. The embodiment of FIG. 5 makes a departure in this layout by having two separate pieces of polysilicon to form the respective gates for the two enable transistors. In the layout of the present invention, this is a space savings advantage over what would normally be assumed to be more efficient space usage. Additional space saving techniques are carried out in the layout of the embodiment of FIG. 5. Namely, a single strip of polysilicon is used for the p- and n-channel transistors N2 and P2 along with a single contiguous strip of polysilicon being used for the gate electrodes and the data node connection from data-true through P1, N1 to N5 within the compare circuit. Thus, a single contiguous piece of polysilicon is used for the two transistors P1 and N1. Similarly, the second memory circuit also uses a contiguous piece of polysilicon 84C for the mask-true interconnect and for the gate electrodes P4 and N4. A single piece of contiguous polysilicon is also used for the gate electrodes N3, P3 and the mask-false connection 98. Separate strips of polysilicon are also used for the gate electrodes T1 and T2. A single contiguous strip of polysilicon is used for the two enable transistors within the compare circuit N9 and N6 which forms a common node of the mask-true connection 84A. Furthermore, each of the respective nodes which are to be connected together are arranged physically adjacent to each other so as to make easy, close, and dense electrical connections to each other. For example, each of the electrical connections to data-false df are arranged in a generally straight horizontal line in proximity to each other so a single metal layer 82B may be easily attached to electrically connect them, as shown in FIG. 6. Similarly, each of the data-true nodes dt are electrically connected close to each other so that a single strip of metal 80B may easily electrically connect them. The nodes in the mask cell 20 are also similarly arranged in proximity to each other. For example, all the nodes MT internal to the mask cell are arranged in proximity to each other so that a single metal layer 84B may easily electrically connect all of the nodes. All the nodes MF are also arranged adjacent to each other, as can be seen in FIGS. 4 and 5, so that a single metal layer 83 may connect them all in a small amount of space. Accordingly, the layout of the first and second memory circuits, in association with the compare circuit, are arranged to use a very small amount of silicon substrate and provide a compact layout with tight densities. In alternative embodiments, of course, the word line of each memory circuit can be arranged differently, with the word lines being made of a common, contiguous strip of polysilicon as can other of the word lines or interconnections within the memory circuit. These alternative embodiments may therefore take a somewhat different layout form than that illustrated.

The operation of the CAM cell provides logical states match (logical high) and not-matched (logical low) on the MATCH line of FIG. 4. The logical states produced by a comparison of the input data signals cf and ct to the memory data signals dt and df. The input data signals cf and ct are complemented prior to presentation to the compare circuit 30 in a known manner. The enable signal MT determines the status of the compare circuit 30 to produce a valid or invalid MATCH signal. Initially, the MATCH signal is set high. When the MATCH is high, a valid match between the stored data of the first memory circuit 10 and the input data is indicated.

In an embodiment of the CAM cell, the operation of the device has the following steps. A data value is stored in the first memory circuit 10. A mask value is stored in the second memory circuit 20. The comparison data is provided to the compare circuit 30. The status of the MATCH signal is monitored for it to remain the same or change state.

The storing of a data value is carried out by applying a high signal to a first word line WLD; applying a first value to a bit line true BLT and a second value to a second bit line BLF; thereby storing a value in the first memory circuit 10 and setting the value of data-true signal dt that is applied to the compare circuit 30 as shown in FIG. 4. The storing of a mask value comprises the steps of applying a value to a second word line WLM; applying a value to the bit line BLT and a second value to a second bit line BLF; thereby storing a mask value in the second memory circuit 20, thereby setting the value of enable signal MT enables transistors N6 and N9 of the compare circuit 30. At some time, the steps of applying values to input signals ct and cf of the compare transistors is carried out, thereby comparing the stored data value dt and df of the first memory circuit 10 to the applied input signal values, ct and cf. If a compare is desired, ct and cf will have opposite values, but if it is desired to perform a global block on the column, then both might be low, When both are low, no compare is done and the entire cell group is blocked out that receives the same ct and cf signals. A match is determined by sensing the status of the MATCH signal line.

The terms drain and source as used herein with respect to an MOS transistor refer to the two regions on either side of the channel of the MOS transistor in the general sense of the two separate regions. The actual identification of a region as the drain or the source may change from time to time depending on the operational characteristics and electrical connection of the transistor, as well as the voltages present at the different nodes. Accordingly, throughout the specification and in the claims the terms drain and source may be interchanged with respect to each other for a particular transistor depending upon its state and the value of the respective nodes. Thus, each of the terms are to be understood as broadly referring to an active region of the transistor and can alternatively refer to either the drain or the source based on the operating state of that particular transistor.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A content addressable memory circuit in a semiconductor substrate comprising:
    a match signal output having a logical state set to a first value;
    a compare circuit for comparing a stored data value to an input compare data value having an enable input, a match output coupled to the match signal output, a compare data input coupled to a compare data signal, and a stored data input, wherein if the enable input receives an enable true signal and the stored data input receives a stored data signal and the compare data false input receives a compare data signal then the logical state of the match signal output will change to a second value thereby indicating a no match;
    a first data storage device for storing a data value having first and second word lines, first and second bit lines, a stored data output, and a first conductive strip electrically coupling the stored data output to the stored data input of the compare circuit wherein the stored data output provides the stored data signal, wherein the first word line of the first data storage device is formed in a first conductive region and the second word line of the first data storage device is formed physically separate and distinct from the first conductive region in a second conductive region; and
    a second data storage device for storing an enable value having first and second word lines, first and second bit lines, an enable output, and a second conductive strip electrically coupling the enable output to the enable input of the compare circuit wherein the enable output provides the enable true signal.

2. The content addressable memory circuit according to claim 1 wherein the first and second conductive regions are formed of polysilicon.

3. The content addressable memory circuit according to claim 1 wherein the first word line of the second data storage device is formed in a third conductive region and the second word line of the second data storage device is formed physically separate and distinct from the third conductive region in a fourth conductive region.

4. The content addressable memory circuit according to claim 3 wherein the third and fourth conductive region are formed of polysilicon.

5. The content addressable memory circuit according to claim 1 wherein the first conductive strip is formed of a single contiguous layer of conductive material.

6. The content addressable memory circuit according to claim 5 wherein the conductive material is polysilicon, a metal or a metal alloy.

7. The content addressable memory circuit according to claim 1 wherein the second conductive strip is formed of a multilayer structure of conductive materials.

8. The content addressable memory circuit according to claim 7 where the multilayer structure comprises first and second polysilicon regions in a first layer being physically separate and electrically coupled to each other through an opening to a conductive material in a second layer.

9. The content addressable memory circuit according to claim 8 wherein the conductive material is polysilicon, a metal or a metal alloy.

10. The content addressable memory circuit according to claim 1 wherein the compare circuit comprises six transistors arranged in two parallel legs of three serially coupled transistors.

11. A content addressable memory circuit in a semiconductor substrate comprising:
    a match signal output having a logical state set to a first value;
    a compare circuit for comparing a stored data value to an input compare data value having an enable input, a match output coupled to the match signal output, a compare data input coupled to a compare data signal, and a stored data input, wherein if the enable input receives an enable true signal and the stored data input receives a stored data signal and the compare data input receives a compare data signal then the logical state of the match signal output will change to a second value thereby indicating a no match;
    a first data storage device for storing a data value having first and second word lines, first and second bit lines, a stored data output, and a first conductive strip electrically coupling the stored data output to the stored data input of the compare circuit wherein the first word line of the first data storage device is formed in a first conductive region and the second word line of the first data storage device is formed physically separate and distinct from the first conductive region in a second conductive region; and
    a second data storage device for storing an enable value having first and second word lines, first and second bit lines, an enable output, and a second conductive strip electrically coupling the enable output to the enable input of the compare circuit wherein the first word line of the second data storage device is formed in a third conductive region and the second word line of the second data storage device is formed physically separate and distinct from the third conductive region in a fourth conductive region.

12. The content addressable memory circuit according to claim 11 wherein the first conductive strip is formed of a common contiguous layer of conductive material.

13. The content addressable memory circuit according to claim 12 wherein the conductive material is polysilicon, a metal or a metal alloy.

14. The content addressable memory circuit according to claim 11 wherein the second conductive strip is formed of a multilayer structure of conductive materials.

15. The content addressable memory circuit according to claim 14 where the multilayer structure comprises a first and second polysilicon regions in a first layer being physically separate and electrically coupled to each other through an opening to a conductive material in a second layer.

16. The content addressable memory circuit according to claim 15 wherein the conductive material is polysilicon, a metal or a metal alloy.

17. The content addressable memory circuit according to claim 11 wherein the compare circuit comprises six transistors arranged in two parallel legs of three serially coupled transistors.

18. A content addressable memory circuit comprising:
a first and second memory circuits, each memory circuit having a first and second pull-down transistor, a first and second pull-up transistor, and a first and second pass transistor, each transistor having a gate, a source region and a drain region;
a compare circuit having a first and second compare transistor, a first and second enable transistor, and a data-true and data-false transistor, each transistor having a gate, a source region and a drain region;
the gate of the first pull-down transistor of the first memory circuit being electrically coupled to the gate of the first pull-up transistor of the first memory circuit, to the drain region of a second pull-down transistor of the first memory circuit, to the drain region of a second pull-up transistor of the first memory circuit, to the drain region of a second pass transistor of the first memory circuit, and to the gate of the data-true transistor of the compare circuit;
the gate of the second pull-down transistor of the first memory circuit being electrically coupled to the gate of the second pull-up transistor of the first memory circuit, to the drain region of the first pull-down transistor of the first memory circuit, to the drain region of the first pull-up transistor of the first memory circuit, to the drain region of the first pass transistor of the first memory circuit, and to the gate of the data-false transistor of the compare circuit;
the gate of the second pull-down transistor of the second memory circuit being electrically coupled to the gate of the second pull-up transistor of the second memory circuit, to the drain region of the first pull-down transistor of the second memory circuit, to the drain region of the first pull-up transistor of the second memory circuit, and to the drain region of the first pass transistor of the second memory circuit;
the gate of the first pull-down transistor of the second memory circuit being electrically coupled to the gate of the first pull-up transistor of the second memory circuit, to the drain region of the second pull-down transistor of the second memory circuit, to the drain region of the second pull-up transistor of the second memory circuit, to the drain region of the second pass transistor of the second memory circuit, and to the gates of the first and second enable transistors of the compare circuit, wherein a first coupling means is formed by a multi-layer interconnect, thereby interconnecting the Sate of the first pull-down transistor of the second memory circuit, the gate of the first pull-up transistor of the second memory circuit, and the gates of the first and second enable transistors of the compare circuit;
the first compare transistor having the gate electrically coupled to a first compare signal, the source region electrically coupled to the drain region of the first enable transistor, and the drain region electrically coupled to a match signal;
the second compare transistor having the gate electrically coupled to a second compare signal, the source region electrically coupled to the drain region of the second enable transistor, and the drain region electrically coupled to the match signal;
the first enable transistor having the source region electrically coupled to the drain region of the data-true transistor;
the second enable transistor having the source region electrically coupled to the drain region of the data-false transistor;
the first pass transistor of the first memory circuit having the gate electrically coupled to a first word line signal, and the source region electrically coupled to a first bit line signal;
the second pass transistor of the first memory circuit having the gate electrically coupled to the first word line signal, and the source region electrically coupled to a second bit line signal;
the first pass transistor of the second memory circuit having the gate electrically coupled to the second word line signal, and the source region electrically coupled to the first bit line signal;
the second pass transistor of the second memory circuit having the gate electrically coupled to the second word line signal, and the source region electrically coupled to the second bit line signal;
a first supply electrically coupled to the source region of first and second pull-down transistors of the first memory circuit, to the source region of the first and second pull-down transistors of the second memory circuit, to the source region of the data-true transistor, and to the source region of the data-false transistor; and
a second supply electrically coupled to the source regions of the first and second pull-up transistors of the first memory circuit, and to the source regions of the first and second pull-up transistors of the second memory circuit.

19. The content addressable memory circuit of claim 18 wherein the first and second enable transistor of the compare circuit form a single transistor being coupled to the first supply at the source region and being coupled to the source regions of the data true and data false transistor of the compare circuit wherein the data true and data false transistors are coupled at the drain region to the source region of the compare false and compare true transistors of the compare circuit.

20. The content addressable memory circuit of claim 18 wherein a second coupling means is formed by a polysilicon region, thereby interconnecting the gate of the first pull-down transistor of the first memory circuit, the gate of the first pull-up transistor of the first memory circuit, and the gate of the data-true transistor of the compare circuit.

21. The content addressable memory circuit of claim 18 wherein a third coupling means is formed by a polysilicon region interconnecting the gates of the first and second enable transistors of the compare circuit.

22. The content addressable memory circuit of claim 18 wherein the multi-layer interconnection comprises a polysilicon region electrically coupled through a contact region to a conductive metal region.

23. The content addressable memory circuit of claim 22 wherein the metal is aluminum, copper, or an alloy thereof.

24. The content addressable memory circuit of claim 18 wherein a first active region is formed below the gate of the first compare transistor, below the gate of the first enable transistor and below the gate of the data-false transistor, and a second active region is formed below the gate of second compare transistor, below the gate of the second enable transistor and below the gate of the data-true transistor.

25. The content addressable memory circuit of claim 24 wherein the first and second active regions are N-type.

26. The content addressable memory circuit of claim 24 wherein the first and second active regions are P-type.

27. A content addressable memory circuit in a semiconductor substrate comprising:
a match signal output having a logical state set to a first value;

a compare circuit for comparing a stored data value to an input compare data value having an enable input, a match output coupled to the match signal output, a compare data input coupled to a compare data signal, and a stored data input, wherein if the enable input receives an enable true signal and the stored data input receives a stored data signal and the compare data false input receives a compare data signal then the logical state of the match signal output will change to a second value thereby indicating a no match;

a first data storage device for storing a data value having first and second word lines, first and second bit lines, a stored data output, and a first conductive strip electrically coupling the stored data output to the stored data input of the compare circuit wherein the stored data output provides the stored data signal; and a second data storage device for storing an enable value having first and second word lines, first and second bit lines, an enable output, and a second conductive strip electrically coupling the enable output to the enable input of the compare circuit wherein the enable output provides the enable true signal, wherein the first word line of the second data storage device is formed in a first conductive region and the second word line of the second data storage device is formed physically separate and distinct from the first conductive region in a second conductive region.

28. A content addressable memory circuit in a semiconductor substrate comprising:

a match signal output having a logical state set to a first value;

a compare circuit for comparing a stored data value to an input compare data value having an enable input, a match output coupled to the match signal output, a compare data input coupled to a compare data signal, and a stored data input, wherein if the enable input receives an enable true signal and the stored data input receives a stored data signal and the compare data false input receives a compare data signal then the logical state of the match signal output will change to a second value thereby indicating a no match;

a first data storage device for storing a data value having first and second word lines, first and second bit lines, a stored data output, and a first conductive strip electrically coupling the stored data output to the stored data input of the compare circuit wherein the stored data output provides the stored data signal; and a second data storage device for storing an enable value having first and second word lines, first and second bit lines, an enable output, and a second conductive strip electrically coupling the enable output to the enable input of the compare circuit wherein the enable output provides the enable true signal, wherein the second conductive strip is formed of a multilayer structure of conductive materials.

* * * * *